United States Patent
Tsuhara et al.

(10) Patent No.: US 9,236,872 B2
(45) Date of Patent: Jan. 12, 2016

(54) VOLTAGE-CONTROLLED OSCILLATOR, SIGNAL GENERATION APPARATUS, AND ELECTRONIC DEVICE

(71) Applicant: SEIKO EPSON CORPORATION, Tokyo (JP)

(72) Inventors: Koichi Tsuhara, Fujimi-machi (JP); Rikiichi Uchino, Tachikawa (JP); Katsuhiko Maki, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/384,248

(22) PCT Filed: Mar. 11, 2013

(86) PCT No.: PCT/JP2013/001580
§ 371 (c)(1),
(2) Date: Sep. 10, 2014

(87) PCT Pub. No.: WO2013/136766
PCT Pub. Date: Sep. 19, 2013

(65) Prior Publication Data
US 2015/0077193 A1 Mar. 19, 2015

(30) Foreign Application Priority Data
Mar. 12, 2012 (JP) ................................. 2012-054176

(51) Int. Cl.
*H03B 5/08* (2006.01)
*H03L 7/099* (2006.01)
(Continued)

(52) U.S. Cl.
CPC .............. *H03L 7/099* (2013.01); *H03B 5/1215* (2013.01); *H03B 5/1228* (2013.01); *H03B 5/1243* (2013.01); *H03B 5/1265* (2013.01); *H03B 1/00* (2013.01); *H03J 2200/10* (2013.01)

(58) Field of Classification Search
CPC ...... H03B 1/00; H03B 5/1212; H03B 5/1243; H03B 5/1246

USPC .............. 331/167, 177 V, 34, 177 R, 116 FE, 331/116 R, 117 FE; 455/260
See application file for complete search history.

(56) References Cited

U.S. PATENT DOCUMENTS 6,013,958 A   1/2000 Aytur
6,876,266 B2 * 4/2005 Koo et al. ................. 331/117 R
(Continued)

FOREIGN PATENT DOCUMENTS

JP   A-6-291653    10/1994
JP   A-2000-68452   3/2000
(Continued)

OTHER PUBLICATIONS

Sjöland, "Transactions Briefs: Improved Switched Tuning of Differential," CMOS VCOs, *IEEE Transactions on Circuits and Systems—II: Analog and Digital Signal Processing*, May 2002, pp. 352-355, vol. 49, No. 5.

*Primary Examiner* — Arnold Kinkead
(74) *Attorney, Agent, or Firm* — Oliff PLC

(57) ABSTRACT

The present invention is for, in a voltage-controlled oscillator in which the oscillation frequency can be adjusted using a capacitor array, reducing drift that occurs in the carrier frequency if the oscillation signal is subjected to frequency modulation after the control loop of the PLL circuit has been cut off. This voltage-controlled oscillator includes an oscillation circuit for performing an oscillation operation at a frequency that corresponds to an inductance and a capacitance between a first node and a second node, a first and second group of capacitors that have first terminals connected to the first node and the second node respectively, a first and second group of transistors that are respectively connected between a reference potential and second terminals of the first group and second group of capacitors, and a first and second group of resistors that are respectively parallel-connected to the first group and second group of transistors.

12 Claims, 4 Drawing Sheets

(51) Int. Cl.
*H03B 5/12* (2006.01)
*H03B 1/00* (2006.01)

(56) References Cited

U.S. PATENT DOCUMENTS

| | | | |
|---|---|---|---|
| 7,102,454 B2 * | 9/2006 | Sze et al. | 331/117 FE |
| 7,474,166 B2 * | 1/2009 | Tanaka | 331/177 V |
| 2003/0227340 A1 | 12/2003 | Koo et al. | |
| 2004/0183611 A1 | 9/2004 | Nakao et al. | |
| 2005/0045986 A1 | 3/2005 | Koo et al. | |
| 2005/0174184 A1 | 8/2005 | Wu | |
| 2010/0052795 A1 | 3/2010 | Nakamura et al. | |
| 2010/0301910 A1 | 12/2010 | Hu et al. | |
| 2011/0187469 A1 | 8/2011 | Okada et al. | |

FOREIGN PATENT DOCUMENTS

| | | |
|---|---|---|
| JP | A-2004-289339 | 10/2004 |
| JP | A-2005-529536 | 9/2005 |
| JP | A-2006-060395 | 3/2006 |
| JP | A-2006-216763 | 8/2006 |
| JP | A-2007-504716 | 3/2007 |
| JP | A-2007-208538 | 8/2007 |
| JP | A-2010-056856 | 3/2010 |
| JP | A-2010-278491 | 12/2010 |
| JP | A-2011-109162 | 6/2011 |
| JP | A-2011-109163 | 6/2011 |
| JP | A-2011-160276 | 8/2011 |
| WO | WO 03/105346 A1 | 12/2003 |
| WO | WO 2005/022597 A2 | 3/2005 |

* cited by examiner

US 9,236,872 B2

VOLTAGE-CONTROLLED OSCILLATOR, SIGNAL GENERATION APPARATUS, AND ELECTRONIC DEVICE

The present application claims a priority based on Japanese Patent Application No. 2012-054176 filed on Mar. 12, 2012, the contents of which are incorporated herein by reference.

TECHNICAL FIELD

The present invention relates to a voltage-controlled oscillator (VCO) in which the oscillation frequency can be adjusted using a capacitor array, and relates to a signal generation apparatus that includes a PLL (Phase-Locked Loop) circuit configured using the voltage-controlled oscillator. The present invention furthermore relates to an electronic device or the like that includes the voltage-controlled oscillator or the signal generation apparatus.

BACKGROUND ART

A signal generation apparatus that includes a PLL circuit configured using a voltage-controlled oscillator has been used in electronic devices that perform wireless communication. The oscillation frequency of the voltage-controlled oscillator is controlled by the PLL circuit so as to match the carrier frequency of the wireless communication channel that is to be used or the corresponding local oscillation frequency. Also, the oscillation signal generated by the voltage-controlled oscillator can be subjected to frequency modulation by changing the control voltage applied to the voltage-controlled oscillator.

However, since the oscillation frequency of the voltage-controlled oscillator fluctuates doe to process variations and temperature variations, there are cases where the oscillation frequency needs to be adjusted (calibrated). For example, in order to adjust the oscillation frequency, multiple capacitors included in a capacitor array are selectively connected to the voltage-controlled oscillator using multiple transistors for switching.

As an example of related technology, Patent Literature 1 discloses a voltage-controlled oscillator that includes: an inductor section and a varactor section that are connected between two nodes; a negative Gm section that is configured by two inverters that are parallel-connected in two directions between the two nodes, and a trimming capacitor array and a bias circuit that are connected to the respective nodes. By giving a bias voltage to the drain of the transistors for cutting off the capacitors, the bias circuit prevents a parasitic diode from switching on, thus making it possible to suppress an increase in phase noise. Here, the bias voltage is set so as to be higher to an the amplification voltage of the negative Gm section.

Also, Patent Literature 2 discloses a semiconductor integrated circuit that is directed to reducing the chip occupancy area as well as reducing fluctuation in the control gain of a digitally-controlled oscillator (DCO). This digitally-controlled oscillator includes an oscillation transistor and a resonance circuit. The resonance circuit includes an inductance, a variable capacity array for coarse frequency adjustment, and a variable capacity array for fine frequency adjustment. The variable capacity array for coarse frequency adjustment includes multiple coarse adjustment capacitor unit cells that are controlled by a coarse adjustment digital control signal having a predetermined number of bits. The variable capacity array for fine frequency adjustment includes multiple fine adjustment capacitor unit cells that are controlled by a fine adjustment digital control signal having a predetermined number of bits. The capacitance values of the coarse adjustment capacitor unit cells and the fine adjustment capacitor unit cells are set according to their respective binary weights.

When the transistors for selectively connecting the capacitors included in the capacitor array to the voltage-controlled oscillator are in the off state, if the voltage between the drain and the semiconductor substrate or the well changes, the parasitic capacitance between the drain and the reference potential (alternating ground potential) changes, and therefore the capacitance applied to the voltage-controlled oscillator changes.

Even if the capacitance applied to the voltage-controlled oscillator changes, as long as the PLL circuit is operating, the control voltage changes so as to absorb the change in capacitance, and thus the oscillation frequency of the voltage-controlled oscillator does not change. However, if the oscillation signal generated by the voltage-controlled oscillator is subjected to frequency modulation after the control loop of the PLL circuit has been cut off, drift will occur in the carrier frequency.

CITATION LIST

Patent Literature

Patent Literature 1: JP-A-2006-60395 (abstract, paragraph 0024)

Patent Literature 2: JP-A-2010-56856 (abstract, claim 1)

SUMMARY OF INVENTION

Technical Problem

According to several aspects of the present invention, in a voltage-controlled oscillator in which the oscillation frequency can be adjusted using a capacitor array, it is possible to reduce drift that occurs in the carrier frequency if the oscillation signal is subjected to frequency modulation after the control loop of the PLL circuit has been cut off.

Solution to Problem

In order to solve the above problems, a voltage-controlled oscillator according to a first aspect of the present invention includes: an oscillation circuit that performs an oscillation operation at a frequency that corresponds to an inductance and a capacitance between a first node and a second node; at least one inductor connected between the first node and the second node; at least a pair of variable capacitance diodes that are connected between the first node and the second node and control the oscillation frequency of the oscillation circuit in accordance with a control voltage; a first group of capacitors that have a first terminal connected to the first node; a first group of transistors that are respectively connected between a reference potential and second terminals of the first group of capacitors, and switch on and off in accordance with respective control signals; a first group of resistors that axe respectively parallel-connected to the first group of transistors; a second group of capacitors that have a first terminal connected to the second node; a second group of transistors that are respectively connected between the reference potential and second terminals of the second group of capacitors, and switch on and off in accordance with respective control signals; and a second group of resistors that are respectively parallel-connected to the second group of transistors.

Here, a ratio of on resistance values of the first group of transistors and a ratio of the reciprocals of capacitance values of the corresponding first group of capacitors may be substantially the same, and a ratio of on resistance values of the second group of transistors and a ratio of the reciprocals of capacitance values of the corresponding second group of capacitors may be substantially the same.

Also, a voltage-controlled oscillator according to a second aspect of the present invention includes: an oscillation circuit that performs an oscillation operation at a frequency that corresponds to an inductance and a capacitance between a first node and a second node; at least one inductor connected between the first node and the second node; at least a pair of variable capacitance diodes that are connected between the first node and the second node and control the oscillation frequency of the oscillation circuit in accordance with a control voltage; a first group of capacitors that have a first terminal connected to the first node; a second group of capacitors that have a first terminal connected to the second node; a plurality of transistors that are respectively connected between second terminals of the first group of capacitors and second terminals of the second group of capacitors, and switch on and off in accordance with respective control signals; a first group of resistors that are respectively connected between a reference potential and the second terminals of the first group of capacitors; and a second group of resistors that are respectively connected between a reference potential and the second terminals of the second group of capacitors.

Here, a ratio of on resistance values of the transistors, a ratio of the reciprocals of capacitance values of the corresponding first group of capacitors, and a ratio of the reciprocals of capacitance values of the corresponding second group of capacitors may be substantially the same.

A signal generation apparatus according to the first aspect of the present invention includes: the voltage-controlled oscillator according to the first aspect of the present invention; a frequency division circuit that divides an oscillation signal generated by the voltage-controlled oscillator and outputs a frequency division signal; an error signal generation circuit that compares at least the phase of the frequency division signal output from the frequency division circuit and at least the phase of a reference signal, and generates an error signal that corresponds to the difference therebetween; a first filter circuit that generates a control voltage for controlling the oscillation frequency of the voltage-controlled oscillator by subjecting the error signal generated by the error signal generation circuit to low-pass filter processing; a first switch circuit that switches on and off a supply of the error signal to the first filter circuit; a second filter circuit that generates a control voltage for controlling the oscillation frequency of the voltage-control led oscillator by subjecting a modulation signal to low-pass filter processing; a second switch circuit that switches on and off a supply of the modulation signal to the second filter circuit; and a control circuit that switches off the first switch circuit and switches on the second switch circuit after a time period longer than or equal to the highest value among time constants respectively determined by capacitance values of the first group and second group of capacitors and resistance values of the corresponding first group and second group of resistors has elapsed from when a power supply voltage was supplied to the voltage-controlled oscillator.

Alternatively, after a power supply voltage has been supplied to the voltage-controlled oscillator, the control circuit may temporarily switch on the first group and second group of transistors and discharge charge at the second terminals of the first group and second group of capacitors, then switch off a predetermined transistor in the first group and second group of transistors, and after the oscillation frequency of the voltage-controlled oscillator is locked, the control circuit may switch off the first switch circuit and switch on the second switch circuit. In this case, the first group and second group of resistors can be omitted.

Also, a signal generation apparatus according to the second aspect of the present invention includes: the voltage-controlled oscillator according to the second aspect of the present invention; a frequency division circuit that divides an oscillation signal generated by the voltage-controlled oscillator and outputs a frequency division signal; an error signal generation circuit that compares at least the phase of the frequency division signal output from the frequency division circuit and at least the phase of a reference signal, and generates an error signal that corresponds to the difference therebetween; a first filter circuit that generates a control voltage for controlling the oscillation frequency of the voltage-controlled oscillator by subjecting the error signal generated by the error signal generation circuit to low-pass filter processing; a first switch circuit that switches on and off a supply of the error signal to the first filter circuit; a second filter circuit that generates a control voltage for controlling the oscillation frequency of the voltage-controlled oscillator by subjecting a modulation signal to low-pass filter processing; a second switch circuit that switches on and off a supply of the modulation signal to the second filter circuit; and a control circuit that switches off the first switch circuit and switches on the second switch circuit after a time period longer than or equal to the highest value among time constants respectively determined by capacitance values of the first group and second group of capacitors and resistance values of the corresponding first group and second group of resistors has elapsed from when a power supply voltage was supplied to the voltage-controlled oscillator.

Furthermore, an electronic device according to the first aspect of the present invention includes any of the above voltage-controlled oscillators or any of the above signal generation apparatuses.

Advantageous Effects of Invention

According to the first aspect of the present invention, due to providing the first group of resistors that are respectively parallel-connected to the first group of transistors and providing the second group of resistors that are respectively parallel-connected to the second group of transistors, or due to temporarily switching on the first group and second group of transistors after the power supply voltage has been supplied to the voltage-controlled oscillator, it is possible to, compared to conventional technology, further reduce drift that occurs in the carrier frequency if the oscillation signal is subjected to frequency modulation after the control loop of the PLL circuit has been cut off.

Also, according to the second aspect of the present invention, due to providing the first group of resistors that are respectively connected between the reference potential and the second terminals of the first group of capacitors and providing the second group of resistors that are respectively connected between the reference potential and the second terminals of the second group of capacitors, multiple transistors can reliably switch on and off, and it is possible to, compared to conventional technology, further reduce drift that occurs in the carrier frequency if the oscillation signal is subjected to frequency modulation after the control loop of the PLL circuit has been cut off.

DESCRIPTION OF EMBODIMENTS

The following is a detailed description of an embodiment of the present invention with reference to the drawings.

Figure 1:
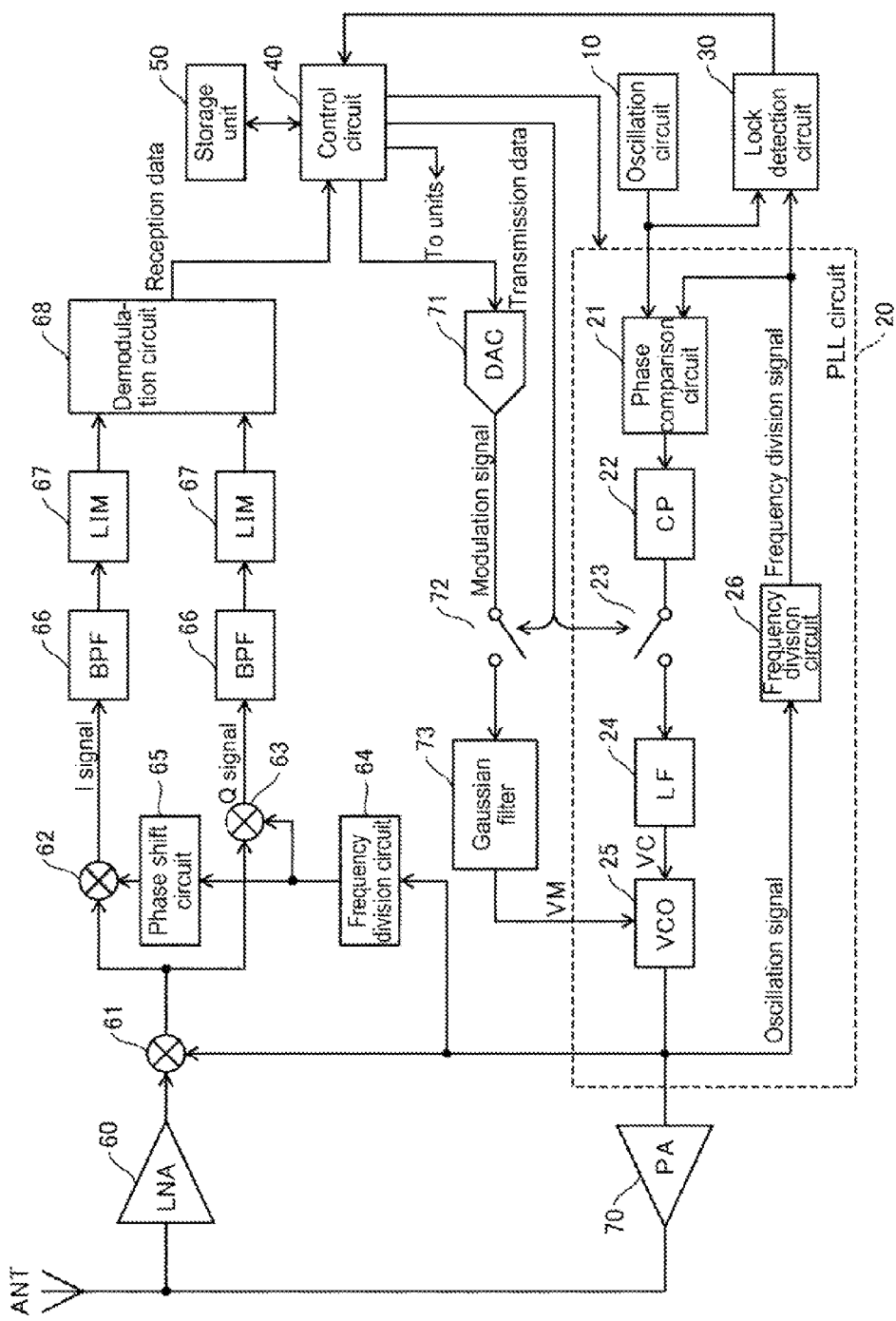
FIG. 1 is a block diagram of an electronic device that employs a signal generation apparatus according to an embodiment of the present invention.

FIG. 1 is a block diagram showing an example of the configuration of an electronic device that employs a signal generation apparatus according to an embodiment of the present invention. The present invention can foe applied to an electronic device such as a wireless mouse, a wireless keyboard, or a personal computer that performs wireless communication.

The electronic device shown in FIG. 1 includes an oscillation circuit 10, a PLL circuit 20, a lock detection circuit 30, a control circuit 40, a storage unit 50, reception system circuits 60 to 68, and transmission system circuits 70 to 73. These circuits may be built into a semiconductor integrated circuit apparatus. Here, the circuits from the PLL circuit 20 to the control circuit 40 and the transmission system circuits 70 to 73 configure a signal generation apparatus that generates a transmission signal having a desired frequency based on a reference signal.

The oscillation circuit 10 generates a reference signal having a predetermined frequency by performing an oscillation operation using a crystal oscillator or the like. If a crystal oscillator is used, the crystal oscillator may be provided outside the semiconductor integrated circuit apparatus, or may be built into the semiconductor integrated circuit apparatus. Alternatively, if is possible to omit the oscillation circuit 10 and supply a reference signal from outside the semiconductor integrated circuit apparatus.

The PLL circuit 20 includes a phase comparison circuit 21, a charge pump (CP) 22, a switch circuit 23, a loop filter (LF) 24, a voltage-controlled oscillator (VCO) 25, and a frequency division circuit 26.

The phase comparison circuit 21 and the charge pump 22 configure an error signal generation circuit that compares at least the phase of the frequency division signal output from the frequency division circuit 26 and at least the phase of the reference signal output from the oscillation circuit 10, and generates an error signal that corresponds to the difference between the two signals.

The phase comparison circuit 21 may compare the phase of the frequency division signal and the phase of the reference signal and output an error signal that corresponds to the difference between the phases of the two signals. The phase comparison circuit 21 may furthermore compare the frequency of the frequency division signal and the frequency of the reference signal and output an error signal that corresponds to the difference between the phases and the frequencies of the two signals. The charge pump 22 performs a charge pump operation based on the error signal output from the phase comparison circuit 21 so as to convert the error signal into a current, and outputs the current.

The switch circuit 23 is configured by one or more MOSFETs (Metal-Oxide-Semiconductor Field-Effect Transistors), and switches the supply of the error signal to the loop filter 24 on and off in accordance with a control signal output from the control circuit 40. Note that the switch circuit 23 may be provided between the phase comparison circuit 21 and the charge pump 22.

The loop filter 24 has low-pass characteristics, and converts the current output from the charge pump 22 into a voltage. Specifically, the loop filter 24 generates a control voltage VC for controlling the oscillation frequency of the VCO 25 by performing low-pass filter processing on the error signal generated by the error signal generation circuit.

When the control voltage VC generated by the loop filter 24 is applied to the VCO 25, the VCO 25 generates an oscillation signal by performing an oscillation operation at an oscillation frequency that corresponds to the control voltage VC. The frequency division circuit 26 generates a frequency division signal by dividing the oscillation signal generated by the VCO 25 with a frequency division ratio set by the control circuit 40.

In this way, the PLL circuit 20 compares the reference signal and the oscillation signal resulting from the frequency division performed by the frequency division circuit 26, generates the control voltage VC, and controls the oscillation frequency of the VCO 23 using the control voltage VC, and thereby generates an oscillation signal having an oscillation frequency that is a multiple of the frequency of the reference signal.

Included among the reception system circuits are a low noise amplifier (LNA) 60, mixers 61 to 63, a frequency division circuit 64, a phase shift circuit 65, two band pass filters (BPF) 66, two limiters (LIM) 67, and a demodulation circuit 68.

The low noise amplifier 60 amplifies, with low noise, the output voltage of an antenna (ANT) that received radio waves (wireless signal) transmitted by an external device, and outputs the resulting reception signal. The mixer 61 down-converts the reception signal output from the low noise amplifier 60 by multiplying the reception signal by the oscillation signal output from the PLL circuit 20 (local oscillation signal), and outputs the resulting intermediate frequency signal.

The frequency division circuit 64 divides the local oscillation signal output from the PLL circuit 20. Furthermore, the phase shift circuit 65 rotates the phase of the output signal from the frequency division circuit 64 by approximately 90°. The mixer 62 down-converts the intermediate frequency signal output from the mixer 61 by multiplying the intermediate frequency signal by the output signal from the phase shift circuit 65, and outputs the resulting I signal. Meanwhile, the mixer 63 down-converts the intermediate frequency signal output from the miser 61 by multiplying the intermediate frequency signal by the output signal from the frequency division circuit 64, and outputs the resulting Q signal.

The I signal and the Q signal are each subjected to band limitation and waveform shaping by being passed through the band pass filter 66 and the limiter 67, and the resulting signals are supplied to the demodulation circuit 68. The following describes the case where GFSK (Gaussian filtered frequency shift keying) is used as the modulation system in wireless communication between the electronic device shown in FIG. 1 and an external device. The demodulation circuit 68 subjects the supplied I signal and Q signal to demodulation processing in accordance with GFSK so as to demodulate the I signal and the Q signal and obtain reception data.

The reception data obtained by the demodulation circuit 68 is output to the control circuit 40. The control circuit 40 controls the units of the electronic device shown in FIG. 1 based on the reception data output from the demodulation circuit 68, operations performed by an operator and the like. The control circuit 40 also outputs transmission data to the transmission system circuits. The storage unit 50 is configured by a register, for example, and stores information related to calibration of the VCO 25 under control of the control circuit 40, for example.

Included among the transmission system circuits are a power amplifier (PA) 70, a digital-analog conversion circuit (DAC) 71, a switch circuit 72, and a Gaussian filter 73.

The DAC 71 generates a modulation signal by subjecting the transmission data output from the control circuit 40 to digital-analog conversion processing. The switch circuit 72 is configured by one or more MOSFETs, and switches the supply of the modulation signal to the Gaussian filter 73 on and off in accordance with a control signal output from the control circuit 40. The Gaussian filter 73 is a low-pass filter that has Gaussian characteristics, and performs band limitation on the modulation signal so as to generate a control voltage (modulation voltage) VM for modulation of the carrier.

When the modulation voltage VM generated by the Gaussian filter 73 is applied to the VCO 25, the VCO 25 modulates the oscillation signal (carrier) by performing an oscillation operation at an oscillation frequency that corresponds to the modulation voltage VM. The power amplifier 70 generates a transmission signal by amplifying the power of the carrier modulated by the VCO 25, and supplies the transmission signal to the antenna (ANT). Radio waves (a wireless signal) are thus transmitted from the antenna to an external device.

Next, an example of operations performed by the electronic device shown in FIG. 1 will be described.

When the electronic device receives a wireless signal in a reception mode or transmits a wireless signal in a transmission mode, the control circuit 40 switches on the switch circuit 23, sets a predetermined frequency division ratio in the frequency division circuit 26, and activates the PLL circuit 20. Accordingly, the PLL circuit 20 generates an oscillation signal.

In the reception mode, if the frequency division ratio in one frequency division circuit 26 is set to $M_R$:1, the frequency division circuit 26 divides the frequency of the oscillation signal to $1/M_R$, thus obtaining an oscillation signal (local oscillation signal) that is the result of multiplying the frequency of the reference signal by a factor of $M_R$. On the other hand, in the transmission mode, if the frequency division ratio in the frequency division circuit 26 is set to $M_T$:1, the frequency division circuit 26 divides the frequency of the local oscillation signal to $1/M_T$, thus obtaining an oscillation signal (carrier) that is the result of multiplying the frequency of the reference signal by a factor of $M_T$.

Furthermore, in the transmission mode, the control circuit 40 switches off the switch circuit 23 and switches on the switch circuit 72 after the oscillation frequency of the VCO 25 has been locked, and thus the carrier is modulated. By performing transmission after setting the PLL circuit 20 to an open loop in the transmission mode in this way, it is possible to lower the power supply voltage for the circuit that is necessary for performing closed loop operations, thus reducing the power consumption.

Figure 2:
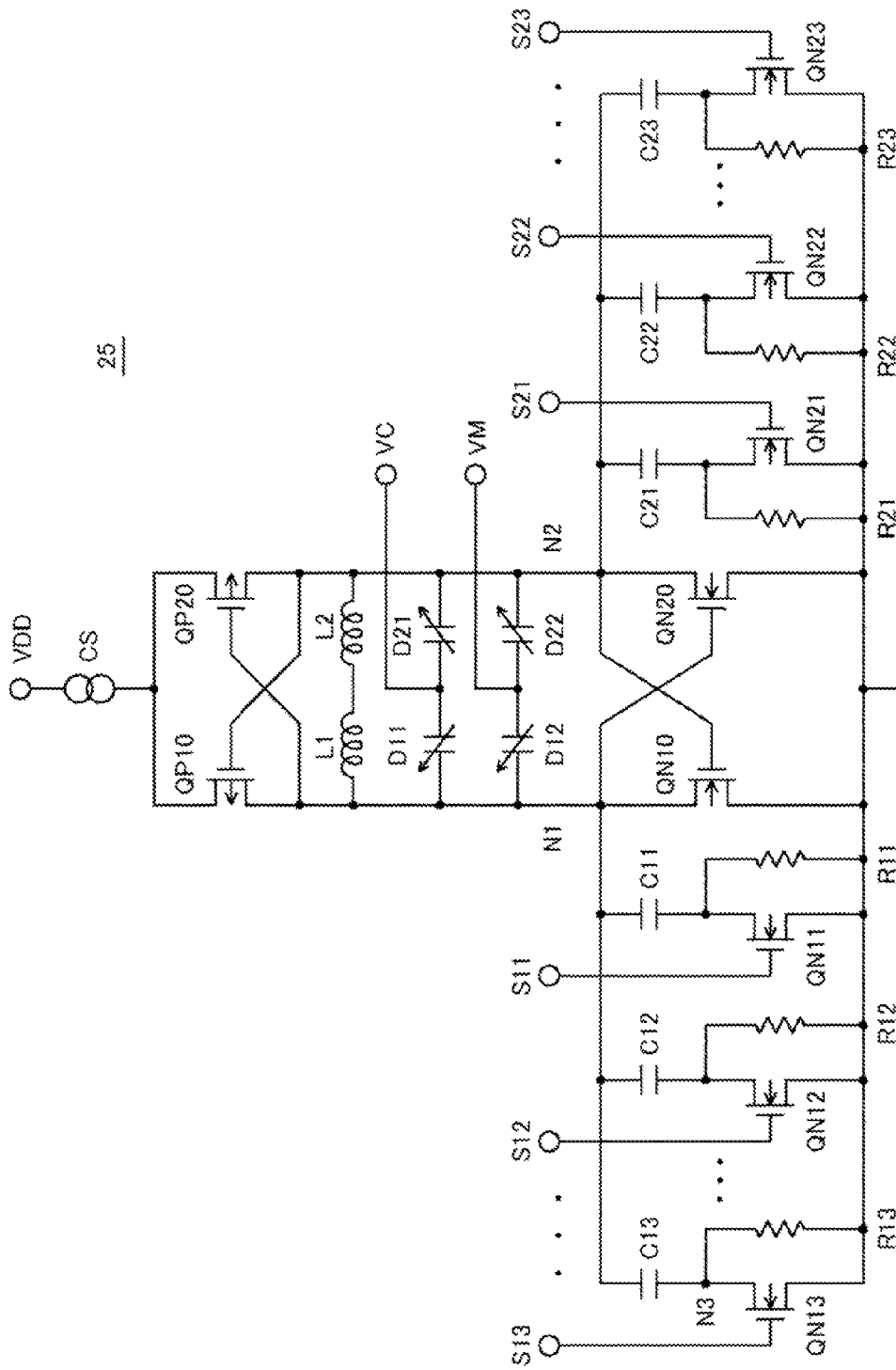
FIG. 2 is a circuit diagram showing an example of a first configuration of a VCO shown in FIG. 1.

FIG. 2 is a circuit diagram showing an example of a first configuration of the VCO 25 shown in FIG. 1. The VCO 25 shown in FIG. 2 includes a current supply CS, P-channel MOS field-effect transistors QP10 and QP20, and N-channel MOS field-effect transistors QN10 and QN20. These elements configure an oscillation circuit that performs an oscillation operation at a frequency that corresponds to the inductance and capacitance between a node N1 and a node N2.

The VCO 25 also includes at least one inductor that is connected between the node N1 and the node N2 (two inductors L1 and L2 are shown in FIG. 2), a pair of variable capacitance diodes (also called varicap or varactor diodes) D11 and D21, and another pair of variable capacitance diodes D12 and D22.

The VCO 25 furthermore includes a first group of capacitors C11 to C13 that configure a first capacitor array, a first group of N-channel MOS field-effect transistors QN11 to QN13, a first group of resistors R11 to R13, a second group of capacitors C21 to C23 that configure a second capacitor array, a second group of N-channel MOS field-effect transistors QN21 to QN23, and a second group of resistors R21 to R23.

The current supply CS is configured by a P-channel MOS field-effect transistor or a resistor, for example, and has one end connected to a power supply potential VDD. The transistor QP10 has a source connected to the other end of the current supply CS, a drain connected to the node N1, and a gate connected to the node N2. The transistor QP20 has a source connected to the other end of the current supply CS, a drain connected to the node N2, and a gate connected to the node N1.

The transistor QN10 has a drain connected to the node N1, a source connected to a power supply potential VSS, and a gate connected to the node N2. The transistor QN20 has a drain connected to the node N2, a source connected to the power supply potential VSS, and a gate connected to the node N1. Note that either the power supply potential VDD or VSS may be the ground potential.

The variable capacitance diode D11 has an anode connected to the node N1, and a cathode to which the control voltage VC is applied. Also, the variable capacitance diode D21 has an anode connected to the node N2, and a cathode to which the control voltage VC is applied. The variable capacitance diodes D11 and D21 set the frequency of the oscillation signal by controlling the oscillation frequency of the oscillation circuit in accordance with the control voltage VC.

The variable capacitance diode D12 has an anode connected to the node N1, and a cathode to which the modulation voltage VM is applied. Also, the variable capacitance diode D22 has an anode connected to the node N2, and a cathode to which the modulation voltage VM is applied. The variable capacitance diodes D12 and D22 perform frequency modulation on the oscillation signal by controlling the oscillation frequency of the oscillation circuit in accordance with the modulation voltage VM. Note that if the modulation voltage VM is applied to the cathodes of the variable capacitance diodes D11 and D21 along with the control voltage VC, the variable capacitance diodes D12 and D22 may be omitted.

The first group of capacitors C11 to C13 chat configure the first capacitor array each have a first terminal connected to the node N1. The first group of transistors QN11 to QN13 have drains that are respectively connected to second terminals of the first group of capacitors C11 to C13, sources connected to the reference potential (the power supply potential VSS in FIG. 2), which is an alternating ground potential, and gates to which control signals S11 to S13 are respectively provided. The transistors QN11 to QN13 switch on and off in accordance with the control signals S11 to S13.

Also, the second group of capacitors C21 to C23 that configure the second capacitor array each have a first terminal connected to the node N2. The second group of transistors QN21 to QN23 have drains that are respectively connected to second terminals of the second group of capacitors C21 to C23, sources connected to the reference potential (the power supply potential VSS in FIG. 2), and gates to which control signals S21 to S23 are respectively provided. The transistors QN21 to QN23 switch on and off in accordance with the control signals S21 to S23.

When a transistor switches on, the corresponding capacitor connected between the power supply potential VSS and the node N1 or N2 forms a resonance circuit along with the inductors L1 and L2 and the variable capacitance diodes D11 to D22. If there is a low number of capacitors connected between the power supply potential VSS and the node N1 or N2, the oscillation frequency of the VCO 25 increases, and if there is a large number of capacitors connected between the power supply potential VSS and the nods N1 or N2, the oscillation frequency of the VCO 25 decreases.

Since a differential amplifier type of VCO is used in the configuration example shown in FIG. 2, the capacitance values of the first group of capacitors C11 to C13 are set so as to be the same as the capacitance values of the second group of capacitors C21 to C23 respectively. Also, the first group of transistors QN11 to QN13 are controlled so as to switch on/off at the same time as the second group of transistors QN21 to QN23 respectively.

If there is a difference between the capacitance values of N capacitors among the capacitors C11 to C13 (C21 to C23), $2^N$ different oscillation frequencies can be realised by the control circuit 40 controlling the switching on/off of the transistors QN11 to QN13 (QN21 to QN23). Accordingly, calibration for correcting the oscillation frequency of the VCO 25 can be performed in correspondence with the carrier frequencies of multiple wireless communication channels.

For example, in a calibration mode prior to wireless communication, the control circuit 40 shown in FIG. 1 changes the capacitors connected between the power supply potential VSS and the node N1 or N2 and measures the control loop characteristics of the PLL circuit 20 for each of the wireless communication channels to be used in wireless communication, and stores information related to the capacitors for correcting the oscillation frequency of the VCO 25 in the storage unit 50.

Also, in the reception mode or the transmission mode in which wireless communication is actually performed, the control circuit 40 reads out the information stored in the storage unit 50, generates the control signals S11 to S13 and S21 to S23 based on that information, and controls the power supply circuit so as to supply a power supply voltage (VDD-VSS) to the PLL circuit 20 including the VCO 25.

In the state in which the power supply voltage has been supplied to the VCO 25 and the potential at the first terminals of the capacitors C11 to C13 and C21 to C23 has risen, if any of the transistors QN11 to QN13 and QN21 to QN23 are off, the drain potential of the off transistor also rises. Although the drain potential fails thereafter, the off resistance of the transistor has a very high value of approximately 10 MΩ, for example, and a long amount of time is needed for the drain potential to return to the power supply potential VSS through merely discharge by the off resistance of the transistor.

Generally, an N-channel transistor has a parasitic capacitance between the N-type drain and the P-type semiconductor substrate or P well (depletion layer capacitance), and the capacitance value of the depletion layer capacitance changes depending on the voltage applied to the P-N junction (see p. 49 of "Semiconductor Device Engineering Learned Through Pictures" by Kenji Taniguchi and Shigeyasu Uno, published by Shokodo). Rote that the power supply potential VSS is supplied to the P-type semiconductor substrate or the P well. Accordingly, if there is a decrease in the drain potential of the transistor that is off, the value of the parasitic capacitance between the drain and the power supply potential VSS increases.

If the switch circuit 23 shown in FIG. 1 is on at this time, the oscillation frequency of the VCO 25 is controlled by the control loop in the PLL circuit 20, and therefore drift does not occur in the oscillation frequency of the VCO 25. However, in the transmission mode, if the switch circuit 23 switches off and the control loop in the PLL circuit 20 is cut off while the value of the parasitic capacitance is changing, drift will occur in the frequency of the oscillation signal (carrier).

In view of this, in the present embodiment, the first group of resistors R11 to R13 that are respectively parallel-connected to the first group of transistors QN11 to QN13, and the second group of resistors R21 to R23 that are respectively parallel-connected to the second group of transistors QN21 to QN23, are provided. In order to reduce the time constant when discharging charge accumulated at the second terminals of the capacitors, the resistance values of the resistors R11 to R13 and R21 to R23 are set to a value sufficiently lower than the off resistance of the transistors, for example less than or equal to 100 kΩ, or desirably less than or equal to 20 kΩ.

The control circuit 40 shown in FIG. 1 switches off the switch circuit 23 and switches on the switch circuit 72 after a time period longer than or equal no the highest value among the time constants respectively determined by the capacitance values of the capacitors C11 to C13 and C21 to C23 and the resistance values of the corresponding resistors R11 to P13 and R21 to R23 has elapsed from when the power supply voltage was supplied to the VCO 25.

For example, the ratio of the capacitance values of the capacitors C11, C12, . . . , C13 may be 1:2:4:8: . . . here. In this case, if the resistance values of the resistors R11 to R13 are the same, the time constant determined by the capacitor C13 and the resistor R13 will be the highest value. Accordingly, the control circuit 40 switches off the switch circuit 23 and switches on the switch circuit 72 after a time period longer than or equal to the time constant determined by the capacitor C13 and the resistor R13 has elapsed from when the power supply voltage was supplied to the VCO 25.

Also, the ratio of the on resistance values of the first group of transistors QN11, QN12, . . . , QN13 and the ratio of the reciprocals of the capacitance values of the corresponding capacitors C11, C12, . . . , C13 may be set so as to be substantially the same. For example, if the ratio of the capacitance values of the capacitors C11, C12, . . . , C13 is 1:2:4:8: . . . , then the ratio of the on resistance values of the transistors QN11, QN12, . . . , QN13 is assumed to be 1:1/2:1/4:1/8: . . . here.

Similarly, the ratio of the on resistance values of the second group of transistors QN21, QN22, . . . , QN23 and the ratio of the reciprocals of the capacitance values of the corresponding capacitors C21, C22, . . . , C23 may be set so as to be substantially the same. For example, if the ratio of the capacitance values of the capacitors C21, C22, . . . , C23 is 1:2:4:8: . . . , then the ratio of the on resistance values of the transistors QN21, QN22, . . . , QN23 is assumed to be 1:1/2:1/4:1/8: . . . here.

In this case, the driving performance of the transistors can be set in conformance with the capacitance values of the capacitors. The on resistance values of the transistors are set by, for example, changing the gate width while keeping the gate length constant.

Figure 3A:
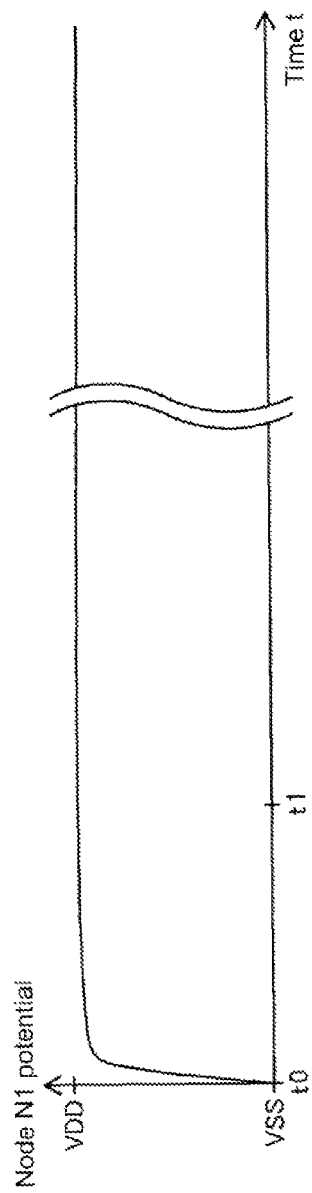
FIG. 3 includes diagrams showing change over time in the potential at the two ends of a capacitor C13 shown in FIG. 2.
Figure 3B:
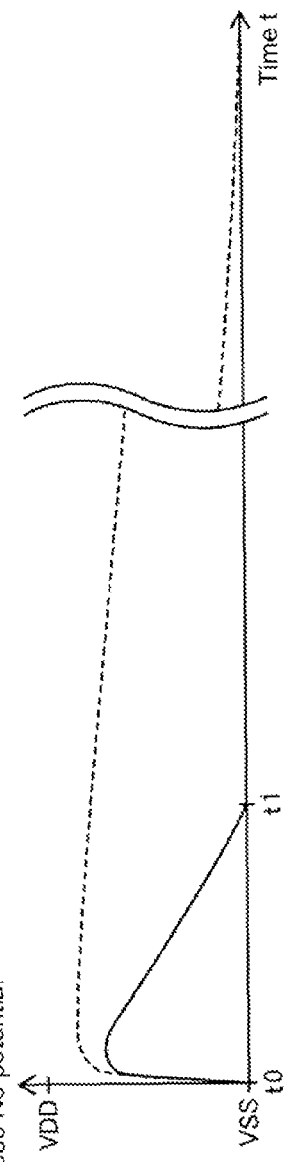

FIG. 3 includes diagrams showing change over time in the potential at the two ends of the capacitor C13 shown in FIG. 2. FIG. 3(a) shows change over time in the DC potential at the node N1 (the first terminal of the capacitor C13), and FIG. 3(b) shows change over time in the DC potential at the node N3 (the second terminal of the capacitor C13. Also, in FIG. 3(b), the dashed line indicates the case where the resistor R13 is not connected, and the solid line indicates the case where the resistor R13 is connected.

When the power supply voltage is supplied to the VCO 25 at a time t0, the potential of the node N1 rises as shown in FIG. 3(a). Also, if the transistor QN13 is off, the potential of the node N3 rises as well, as shown in FIG. 3(b). As shown by the dashed line in FIG. 3(b), if the resistor R13 is not connected, a long period is needed for the potential of the node N3 to return to the power supply potential VSS. On the other hand, as shown by the solid line in FIG. 3(b), if the resistor R13 is connected, a shorter period is needed for the potential of the node N3 to return to the power supply potential VSS.

The control circuit 40 shown in FIG. 1 switches off the switch circuit 23 at a time t1 at which a time period longer than or equal to the time constant determined by the capacitor C13 and the resistor R13 has elapsed from when the power supply voltage was supplied to the VCO 25, and at which the oscillation frequency of the VCO 25 is locked near a predetermined frequency. At the time t1, the potential of the node N3 is sufficiently near the power supply potential VSS, and therefore even if the switch circuit 23 is switched off, drift in the carrier frequency in the VCO 25 is suppressed to a narrow range.

Alternatively, after the power supply voltage has been supplied to the VCO 25, the control circuit 40 may temporarily switch on the transistors QN11 to QN13 and QN21 to QN23 and discharge the charge at the second terminals of the capacitors C11 to C13 and C21 to C23. Furthermore, the control circuit 40 may switch off predetermined transistors among the transistors QN11 to QN13 and QN21 to QN23, and then after the oscillation frequency of the VCO 25 is locked, the control circuit 40 may switch off the switch circuit 23 and switch on the switch circuit 72. In this case, it is possible to omit the resistors R11 to R13 and R21 to R23 shown in FIG. 2.

Here, whether or not the oscillation frequency of the VCO 25 is locked may be determined by the control circuit 40 based on the amount of time that has elapsed from when the power supply voltage was supplied to the PLL circuit 20, or may foe determined by the lock detection circuit 30. The lock detection circuit 30 compares the reference signal output from the oscillation circuit 10 and the frequency division signal output from the PLL circuit 20, and determines whether or not the PLL circuit is locked based on the phase difference between the two signals. For example, if the phase difference between the reference signal and the frequency division signal is less than or equal to a predetermined value over a predetermined time period, the lock detection circuit 30 detects that the PLL circuit 20 is locked.

Figure 4:
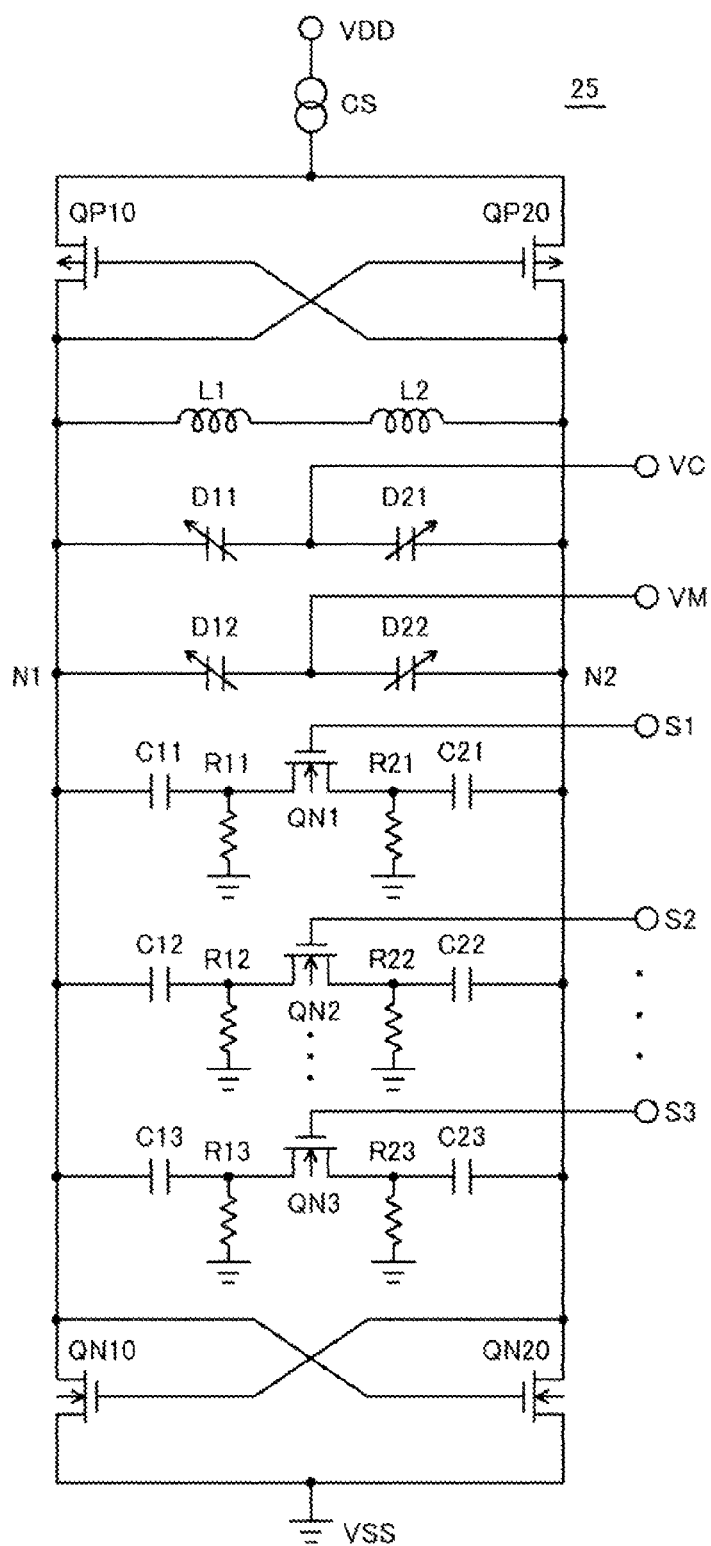
FIG. 4 is a circuit diagram showing an example of a second configuration of the VCO shown in FIG. 1.

FIG. 4 is a circuit diagram showing an example of a second configuration of the VCO 25 shown in FIG. 1. The connections related to the oscillation circuit configured by the current supply CS and the transistors QP10, QP20, QN10, and QN20, as well as the inductors L1 and L2 and the variable capacitance diodes D11 to D22 are similar to the connections in the example of the first configuration shown in FIG. 2. Note that in the example of the second configuration, the power supply potential VSS is the ground potential.

Furthermore, the VCO 25 includes the first group of capacitors C11 to C13 that configure the first capacitor array, the second group of capacitors C21 to C23 that configure the second capacitor array, the N-channel MOS field-effect transistors QN1 to QN3, the first group of resistors R11 to R13, and the second group of resistors R21 to R23.

The first group of capacitors C11 to C13 that configure the first capacitor array each have a first terminal connected to the node N1. Also, the second group of capacitors C21 to C23 that configure the second capacitor array each have a first terminal connected to the node N2.

The transistors QN1 to QN3 have drains or sources that are respectively connected to the second terminals of the first group of capacitors C11 to C13, sources or drains respectively connected to the second terminals of the second group of capacitors C21 to C23, and gates respectively connected to the control signals S1 to S3. The transistors QN1 to QN3 switch on and off in accordance with the control signals S1 to S3.

When a transistor switches on, the corresponding capacitor connected between the node N1 and the node N2 forms a resonance circuit along with the inductors L1 and L2 and the variable capacitance diodes D11 to D22. If there is a low number of capacitors connected between the node N1 and the node N2, the oscillation frequency of the VCO 25 increases, and if there is a large number of capacitors connected between the node N1 and the node N2, the oscillation frequency of the VCO 25 decreases.

Since a differential amplifier type of VCO is used in the configuration example shown in FIG. 4, the capacitance values of the first group of capacitors C11 to C13 are set so as to be the same as the capacitance values of the second group of capacitors C21 to C23 respectively.

Here, if the drains and the sources of the transistors QN1 to QN3 are floating drains and sources, there is the risk of the transistors not being able to reliably switch on and off. In view of this, the present embodiment includes the provision of the first group of resistors R11 to R13 connected between the reference potential (the power supply potential VSS in FIG. 4) and the second terminals of the first group of capacitors C11 to C13 (the drains or the sources of the transistors QN1 to QN3) respectively.

Furthermore, when any of the transistors QN1 to QN3 are switched off, in order to prevent leakage correct from flowing to the transistors that are off, it is preferable that the second group of resistors R21 to R23 that respectively have the same resistance values as the resistance values of the first group of resistors R11 to R13 are connected between the reference potential and the second terminals of the second group of capacitors C21 to C23 (the sources or the drains of the transistors QN1 to QN3).

In order to reduce the time constant when discharging the charge accumulated at the second terminals of the capacitors, the resistance values of the resistors R11 to R13 and R21 to R23 are set to a value less than or equal to 100 kΩ, or desirably less than or equal to 20 kΩ.

In the state in which the power supply voltage has been supplied to the VCO 25 and the potential at the first terminals of the capacitors C11 to C13 and C21 to C23 has risen, the drain potentials and the source potentials of the transistors QN1 to QN3 also rise. Although the drain potentials and the source potentials fail thereafter, this is accompanied by a rise in the values of the parasitic capacitances between the power supply potential VSS and the drains and the parasitic capacitance between the power supply potential VSS and the sources.

If the switch circuit 23 shown in FIG. 1 is on at this time, the oscillation frequency of the VCO 25 is controlled by the control loop in the PLL circuit 20, and therefore drift does not occur in the oscillation frequency of the VCO 25. However, in the transmission mode, if the switch circuit 23 shown in FIG.

1 switches off and the control loop in the PLL circuit 20 is cut off while the value of the parasitic capacitance is changing, drift will occur in the frequency of the oscillation signal (carrier).

In view of this, the control circuit 40 shown in FIG. 1 switches off the switch circuit 23 and switches on the switch circuit 72 after a time period longer than or equal to the highest value among the time constants respectively determined by the capacitance values of the capacitors C11 to C13 and C21 to C23 and the resistance values of the corresponding resistors R11 to R13 and R21 to R23 has elapsed from when the power supply voltage was supplied to the VCO 25.

For example, the ratio of the capacitance values of the capacitors C11, C12, ..., C13 may be 1:2:4:8: ... here. In this case, if the resistance values of the resistors R11 to R13 are the same, the time constant determined by the capacitor C13 and the resistor R13 will be the highest value. Accordingly, the control circuit 40 switches off the switch circuit 23 and switches on the switch circuit 72 after a time at which a time period longer than or equal to the time constant determined by the capacitor C13 and the resistor R13 has elapsed from when the power supply voltage was supplied to the VCO 25, and at which the oscillation frequency of the VCO 25 is looked near a predetermined frequency.

Also, the ratio of the on resistance values of the transistors QN1, QN2, ..., QN3, the ratio of the reciprocals of the capacitance values of the corresponding first group of capacitors C11, C12, ..., C13 in the first capacitor array, and the ratio of the reciprocals of the capacitance values of the corresponding second group of capacitors C21, C22, ..., C23 in the second capacitor array may be set so as to foe substantially the same.

For example, if the ratio of the capacitance values of the capacitors C11, C12, ..., C13 and the ratio of the capacitance values of the capacitors C21, C22, ..., C23 is 1:2:4:8: ..., then the ratio of the on resistance values of the transistors QN1, QN2, ..., QN3 is set to 1:1/2:1/4:1/8: ... here. In this case, the driving performance of the transistors can be set in conformance with the capacitance values of the capacitors.

Although the case of using MOSFETs is described in the above embodiment, another type of field-effect transistor or bipolar transistors may foe used. If a bipolar transistor is used, the base, the emitter, and the collector of the bipolar transistor correspond to the gate, the source, and the drain of a field-effect transistor. Also, the present invention is not limited to the embodiment described above, and many variations within the technical idea of the present invention can be made by a person with general knowledge in the corresponding technical field.

REFERENCE SIGNS LIST

10 Oscillation circuit
20 PLL circuit
21 Phase comparison circuit
22 Charge pump
23 Switch circuit
24 Loop filter
25 VCO
26 Frequency division circuit
30 Look detection circuit
40 Control circuit
50 Storage unit
60 Low noise amplifier
61-63 Mixer
64 Frequency division circuit
65 Phase shift circuit
66 Band pass filter
67 Limiter
68 Demodulation circuit
70 Power amplifier
71 DAC
72 Switch circuit
73 Gaussian filter
CS Current supply
QP10, QP20 P-channel MOS field-effect transistor
QN1-QN23 N-channel MOS field-effect transistor
L1, L2 Inductor
D11-D22 Variable capacitance diode
C11-C23 Capacitor
R11-R23 Resistor

The invention claimed is:

1. A signal generation apparatus comprising:
a voltage-controlled oscillator that includes an oscillation circuit for performing an oscillation operation at a frequency that corresponds to an inductance and a capacitance between a first node and a second node, a first group of capacitors that have a first terminal connected to the first node, a first group of transistors that are respectively connected between a reference potential and second terminals of the first group of capacitors and switch on and off in accordance with respective control signals, a first group of resistors that are respectively parallel-connected to the first group of transistors, a second group of capacitors that have a first terminal connected to the second node, a second group of transistors that are respectively connected between the reference potential and second terminals of the second group of capacitors and switch on and off in accordance with respective control signals, and a second group of resistors that are respectively parallel-connected to the second group of transistors;
a frequency division circuit that divides an oscillation signal generated by the voltage-controlled oscillator and outputs a frequency division signal;
an error signal generation circuit that compares at least the phase of the frequency division signal output from the frequency division circuit and at least the phase of a reference signal, and generates an error signal that corresponds to the difference therebetween;
a first filter circuit that generates a control voltage for controlling the oscillation frequency of the voltage-controlled oscillator by subjecting the error signal to low-pass filter processing;
a first switch circuit that switches on and off a supply of the error signal to the first filter circuit;
a second filter circuit that generates a control voltage for controlling the oscillation frequency of the voltage-controlled oscillator by subjecting a modulation signal to low-pass filter processing;
a second switch circuit that switches on and off a supply of the modulation signal to the second filter circuit; and
a control circuit that controls the first switch circuit and the second switch circuit.

2. The signal generation apparatus according to claim 1, wherein the control circuit switches off the first switch circuit and switches on the second switch circuit after a time period longer than or equal to the highest value among time constants respectively determined by capacitance values of the first group and second group of capacitors and resistance values of the corresponding first group and second group of resistors has elapsed from when a power supply voltage was supplied to the voltage-controlled oscillator.

3. The signal generation apparatus according to claim 1, wherein after a power supply voltage has been supplied to the voltage-controlled oscillator, the control circuit temporarily switches on the first group and second group of transistors and discharges charge at the second terminals of the first group and second group of capacitors, then switches off a predetermined transistor in the first group and second group of transistors, and after the oscillation frequency of the voltage-controlled oscillator is locked, the control circuit switches off the first switch circuit and switches on the second switch circuit.

4. A signal generation apparatus comprising:
a voltage-controlled oscillator that includes
   an oscillation circuit that performs an oscillation operation at a frequency that corresponds to an inductance and a capacitance between a first node and a second node,
   a first capacitor that has a first terminal connected to the first node,
   a first transistor that is connected between a reference potential and a second terminal of the first capacitor and switches on and off in accordance with a control signal,
   a first resistor that is parallel-connected to the first transistor,
   a second capacitor that has a first terminal connected to the second node,
   a second transistor that is connected between the reference potential and the second terminal of the second capacitor and switches on and off in accordance with a control signal, and
   a second resistor that is parallel-connected to the second transistor;
a frequency division circuit that divides an oscillation signal generated by the voltage-controlled oscillator and outputs a frequency division signal;
an error signal generation circuit that compares at least the phase of the frequency division signal output from the frequency division circuit and at least the phase of a reference signal, and generates an error signal that corresponds to the difference therebetween;
a filter circuit that generates a control voltage for controlling the oscillation frequency of the voltage-controlled oscillator by subjecting the error signal to low-pass filter processing;
a switch circuit that switches on and off a supply of the error signal to the filter circuit; and
a control circuit that controls the switch circuit;
wherein letting a time constant determined by a capacitance value of the first capacitor and a resistance value of the first resistor be a first time constant, and letting a time constant determined by a capacitance value of the second capacitor and a resistance value of the second resistor be a second time constant, the control circuit switches off the switch circuit after a time period longer than or equal to the highest value out of the first time constant and the second time constant has elapsed from when a power supply voltage was supplied to the voltage-controlled oscillator.

5. A signal generation apparatus comprising:
a voltage-controlled oscillator that includes
   an oscillation circuit that performs an oscillation operation at a frequency that corresponds to an inductance and a capacitance between a first node and a second node,
   a first capacitor that has a first terminal connected to the first node,
   a second capacitor that has a first terminal connected to the second node,
   a transistor that is connected between a second terminal of the first capacitor and a second terminal of the second capacitor, and switches on and off in accordance with a control signal,
   a first resistor that is connected between a reference potential and the second terminal of the first capacitor, and
   a second resistor that is connected between the reference potential and the second terminal of the second capacitor;
a frequency division circuit that divides an oscillation signal generated by the voltage-controlled oscillator and outputs a frequency division signal;
an error signal generation circuit that compares at least the phase of the frequency division signal output from the frequency division circuit and at least the phase of a reference signal, and generates an error signal that corresponds to the difference therebetween;
a filter circuit that generates a control voltage for controlling the oscillation frequency of the voltage-controlled oscillator by subjecting the error signal generated by the error signal generation circuit to low-pass filter processing;
a switch circuit that switches on and off a supply of the error signal to the filter circuit; and
a control circuit that controls the switch circuit;
wherein letting a time constant determined by a capacitance value of the first capacitor and a resistance value of the first resistor be a first time constant, and letting a time constant determined by a capacitance value of the second capacitor and a resistance value of the second resistor be a second time constant, the control circuit switches off the switch circuit after a time period longer than or equal to the highest value out of the first time constant and the second time constant has elapsed from when a power supply voltage was supplied to the voltage-controlled oscillator.

6. A signal generation apparatus comprising:
a voltage-controlled oscillator that includes
   an oscillation circuit that performs an oscillation operation at a frequency that corresponds to an inductance and a capacitance between a first node and a second node,
   a capacitor that has a first terminal connected to the first node,
   a resistor that is connected between a reference potential and a second terminal of the capacitor, and
   a transistor that has a source terminal or a drain terminal connected to the second terminal of the capacitor;
a frequency division circuit that divides an oscillation signal generated by the voltage-controlled oscillator and outputs a frequency division signal;
an error signal generation circuit that compares at least the phase of the frequency division signal output from the frequency division circuit and at least the phase of a reference signal, and generates an error signal that corresponds to the difference therebetween;
a filter circuit that generates a control voltage for controlling the oscillation frequency of the voltage-controlled oscillator by subjecting the error signal generated by the error signal generation circuit to low-pass filter processing;
a switch circuit that switches on and off a supply of the error signal to the filter circuit; and
a control circuit that controls the switch circuit;

wherein letting a time constant determined by a capacitance value of the capacitor and a resistance value of the resistor be a first time constant, the control circuit switches off the switch circuit after a time period longer than or equal to the first time constant has elapsed from when a power supply voltage was supplied to the voltage-controlled oscillator.

7. An electronic device comprising the signal generation apparatus according to claim 1.

8. An electronic device comprising the signal generation apparatus according to claim 2.

9. An electronic device comprising the signal generation apparatus according to claim 3.

10. An electronic device comprising the signal generation apparatus according to claim 4.

11. An electronic device comprising the signal generation apparatus according to claim 5.

12. An electronic device comprising the signal generation apparatus according to claim 6.

* * * * *